United States Patent
Franson et al.

(10) Patent No.: US 6,952,044 B2
(45) Date of Patent: Oct. 4, 2005

(54) MONOLITHIC BRIDGE CAPACITOR

(75) Inventors: Steven J. Franson, Scottsdale, AZ (US); Rudy M. Emrick, Gilbert, AZ (US); Bruce A. Bosco, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 109 days.

(21) Appl. No.: 10/161,423

(22) Filed: May 31, 2002

(65) Prior Publication Data

US 2003/0222328 A1 Dec. 4, 2003

(51) Int. Cl.$^7$ .............................................. H01L 29/40
(52) U.S. Cl. ........................ 257/664; 257/752; 257/753
(58) Field of Search ................................ 257/164, 663, 257/655, 303, 296, 752, 753; 438/393

(56) References Cited

U.S. PATENT DOCUMENTS

| | | | | |
|---|---|---|---|---|
| 5,384,486 A | * | 1/1995 | Konno | 257/752 |
| 5,459,633 A | * | 10/1995 | Kosslowski et al. | 361/304 |
| 6,075,713 A | * | 6/2000 | Lee et al. | 361/821 |
| 6,198,123 B1 | * | 3/2001 | Linder et al. | 257/306 |
| 2002/0008301 A1 | * | 1/2002 | Liou et al. | 257/531 |
| 2002/0179951 A1 | * | 12/2002 | Yoshiyama et al. | 257/303 |
| 2002/0179952 A1 | * | 12/2002 | Nakata | 257/303 |

* cited by examiner

*Primary Examiner*—Hoa Pham
*Assistant Examiner*—Nathan W. Ha

(57) ABSTRACT

According to the most preferred embodiments of the present invention, at least one of the two plates of a capacitor is formed in at least two different layers of an integrated circuit. The methods of the present invention uses "air bridges" or some other dielectric medium to isolate certain portions of the two capacitive plates of a capacitor where at least a portion of one of the capacitive plates passes over at least a portion of the other capacitive plate. The line widths, line separation and number of levels used in the topology of the capacitor will determine the overall capacitance value of a given structure.

7 Claims, 3 Drawing Sheets

MONOLITHIC BRIDGE CAPACITOR

TECHNICAL FIELD

The present invention relates generally to capacitors and more particularly to capacitors fabricated in a monolithic integrated circuit (IC).

BACKGROUND OF THE INVENTION

Monolithic integrated circuits, such as MMICs (Monolithic Microwave Integrated Circuits), are devices that effectively utilize the electron transport characteristics of compound semiconductor materials to create relatively high-speed FETs (Field Effect Transistors). Accordingly, application of such MMICs to microwave or millimeter wave ICs for satellites, cellular phones and other mobile communications devices has been promoted, and the demand for MMICs has increased along with the proliferation of such mobile communication devices in recent years.

A typical MMIC comprises active and passive elements, such as FETs, resistors, MIM (Metal Insulator Metal) capacitors, interdigital capacitors, spiral inductors, thin-film resistors, and various wiring layers for connecting these elements.

In a standard monolithic microwave IC, one problem is the effective fabrication of components to achieve relative compactness to reduce circuit size, thereby increasing the yield and decreasing manufacturing costs for a given fabrication process while simultaneously maintaining the desired operating characteristics of the individual components. This problem is particularly manifest in the substantial efforts required to achieve a compact capacitor with high capacitance.

During standard MMIC design, the typical circuit element of choice for circuits requiring high capacitance is the MIM capacitor. The MIM capacitor is selected for its ability to provide relatively effective capacitance values in a relatively small amount of space. Unfortunately, the standard MIM capacitor cannot always be reliably manufactured with capacitance values lower than approximately 2 pf.

While attempts to fabricate MIM capacitors with sub-2 pf capacitance values have occasionally been successful, the manufacturing yield (defined as the unacceptable variation in capacitance value) of these circuits is generally lower than desired for most mass production requirements. The low yield of MIM capacitors with sub-2 pf capacitance is caused by the tolerances relative to the dielectric thickness between the two plates of the capacitor. This problem is particularly accentuated on small capacitors due to a relatively larger percentage change in capacitor plate area, which results from typical photo-lithography process variations when printing the metal plates that form the capacitor plate area and the dielectric layers that separate the capacitor plates.

In those situations where high manufacturing yields and lower capacitance are desired, the designer will usually rely on a standard interdigital style capacitor. The typical interdigital capacitor allows for the realization of small capacitance values with less sensitivity to process variation and is, therefore, suitable for circuit designs where high yields are important. However, one potential drawback of the interdigital capacitor is that it is measurably larger in area than a traditional MIM capacitor. This means that while an interdigital capacitor produces a higher yield for smaller capacitance value capacitors, it provides relatively low capacitance when the overall capacitor-size-to-capacitance values are considered. Accordingly, circuit designers are often forced to compromise the size of an IC in order to ensure reliable circuits with a manufacturing yield that will be economically viable. This problem is only exacerbated by the increasing demand for high frequency communication circuits.

In view of the foregoing, it should be appreciated that it would be desirable to increase the yield rate of MIM capacitors with smaller capacitance values. In addition, it would be desirable to provide new methods and techniques for fabricating capacitors with smaller capacitance ratings in a smaller area without requiring the addition of new and costly processing steps. Furthermore, additional desirable features will become apparent to those skilled in the art from the drawings, foregoing background of the invention, following detailed description of the drawings, appended claims, and abstract of the invention.

BRIEF DESCRIPTION OF THE DRAWINGS

The present invention will hereinafter be described in conjunction with the appended drawing figures, wherein like numerals denote like elements, and.

DETAILED DESCRIPTION OF THE DRAWINGS

The following detailed descriptions of various preferred embodiments of the present invention are merely exemplary in nature and are not intended to limit the invention or the application or use thereof. In the most preferred embodiments of the present invention, at least one of the two plates of a monolithic capacitor is formed in at least two different layers.

The methods of the present invention use "air bridges" or some other dielectric medium to isolate certain portions of the two capacitive plates where at least a portion of one of the capacitive plates passes over at least a portion of the other capacitive plate. The use of the air-bridge or other dielectric medium contributes to an increased capacitance in a given area by positioning certain portions of the capacitive plates in parallel configurations and also multiple sections of one capacitive plate over certain portions of the opposing capacitive plate. The line widths, line separation and number of levels used in the topology of the capacitor will determine the overall capacitance value of a given structure.

Figure 5:
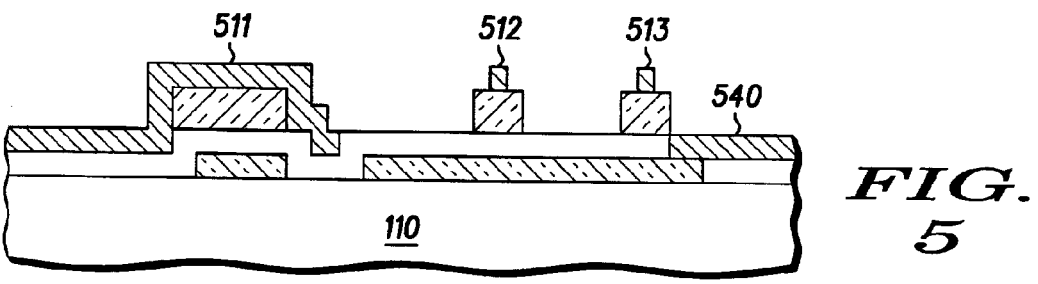
FIG. 5 is a sectional view of a fifth process step to create a monolithic bridge capacitor according to an exemplary embodiment of the present invention.
Figure 6:
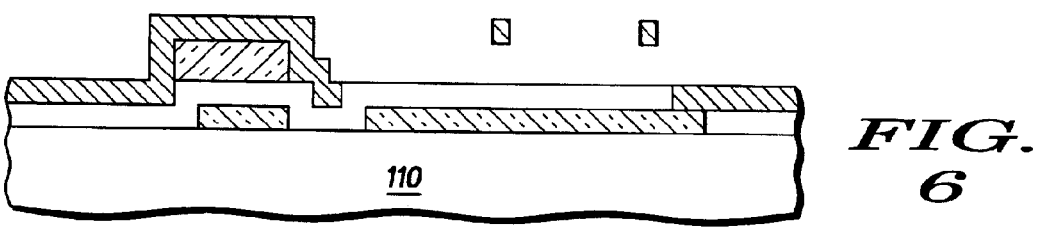
FIG. 6 is a sectional view of a sixth process step to create a monolithic bridge capacitor according to an exemplary embodiment of the present invention.
Figure 7:
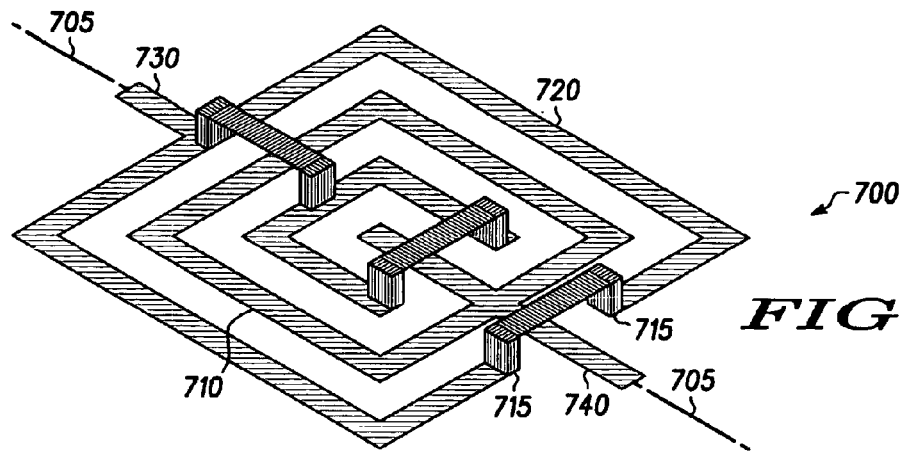
FIG. 7 is a schematic diagram of a monolithic bridge capacitor according to an exemplary embodiment of the present invention.

FIGS. 1–6 are cross-sectional views showing the basic formation of the final structure represented in FIG. 7, according to one standard or typical process suitable for fabricating a monolithic bridge capacitor according to a preferred embodiment of the present invention. Those skilled in the art will recognize that many additional steps may be included without departing from the basic process depicted in FIGS. 1–6 and no attempt has been made to detail every process step required, but only the most salient steps are presented. Additionally, those skilled in the art will recognize that other processes may be employed to achieve similar results. All such processes and process steps are contemplated for use with the methods of the present invention.

Figure 1:
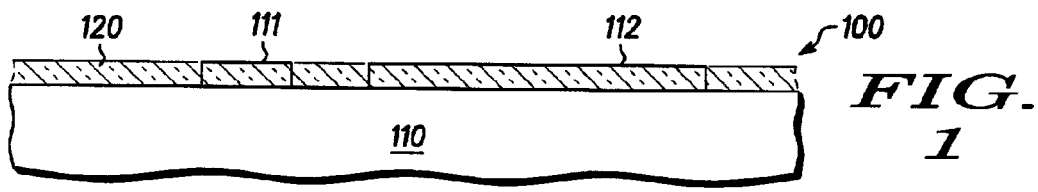
FIG. 1 is a sectional view of a first process step to create a monolithic bridge capacitor according to an exemplary embodiment of the present invention.

Referring now to FIG. 1, a first process step in fabricating a monolithic bridge capacitor 100 in accordance with a preferred exemplary embodiment of the present invention is shown. As shown in FIG. 1, a substrate 110 is provided and a first metallization layer 120 is formed on substrate 110 and etched to create metal structures 111 and 112. Metal structures 111 and 112 will eventually become the first capacitive plate for monolithic bridge capacitor 100.

While substrate 110 is preferably a compound semiconductor such as gallium arsenide, indium phosphide, or gallium nitride, any suitable substrate used in the semiconductor fabrication processes known to those skilled in the art may be utilized in the preferred exemplary embodiments of the present invention. First metallization layer 120 may be created by any number of processes, including deposition and sputtering. In the most preferred embodiments of the present invention, first metallization layer 120 is manufactured from a conductive metal such as gold or copper but any suitable metal or metal alloy know to those skilled in the art may be used. Metallization layer 120 is formed by any suitable method known to those skilled in the art.

Figure 2:
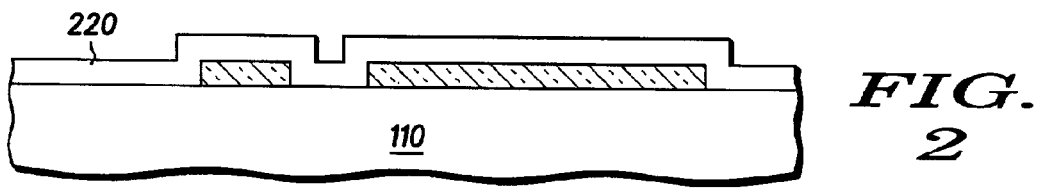
FIG. 2 is a sectional view of a second process step to create a monolithic bridge capacitor according to an exemplary embodiment of the present invention.

Referring now to FIG. 2, a second process step in fabricating a monolithic bridge capacitor 100 in accordance with a preferred exemplary embodiment of the present invention is shown. In this step, a dielectric layer 220 is formed over substrate 110 and metal structures 111 and 112. Dielectric layer 220 is typically an insulating material and is most preferably comprised of silicon nitride, or similar material suitable for the purpose of insulating various layers of integrated circuits. Dielectric layer 220 is typically formed by deposition or using a PECVD process and is then etched to form a series of vias to provide any desired connections between the two metal layers.

Figure 3:
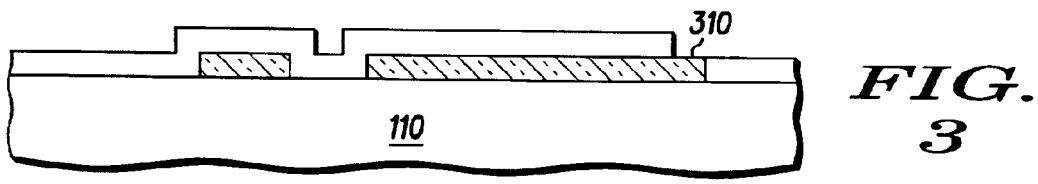
FIG. 3 is a sectional view of a third process step to create a monolithic bridge capacitor according to an exemplary embodiment of the present invention.

Referring now to FIG. 3, a third process step in fabricating a monolithic bridge capacitor 100 in accordance with a preferred exemplary embodiment of the present invention is shown. In this step, at least a portion of dielectric layer 220 is etched away to form contact point 310. Contact point 310 will eventually provide a means for connecting monolithic bridge capacitor 100 to a larger circuit or device.

Figure 4:
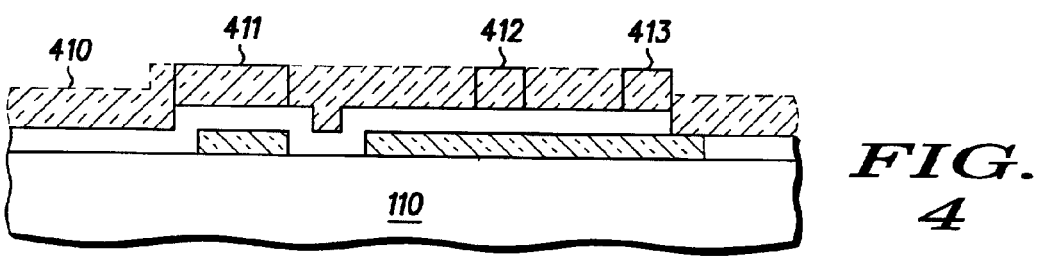
FIG. 4 is a sectional view of a fourth process step to create a monolithic bridge capacitor according to an exemplary embodiment of the present invention.

Referring now to FIG. 4, a fourth process step in fabricating a monolithic bridge capacitor 100 in accordance with a preferred exemplary embodiment of the present invention is shown. In this step, a bridge definition layer 410 is formed over certain portions of dielectric layer 220. Bridge definition layer 410 is typically an insulating material such as a thick photoresist film, which is patterned to define a series of structures suitable for air bridges, and may be removed after the next metal deposition. As shown in FIG. 4, portions of bridge definition layer 410 have been removed and bridge portions 411, 412, and 413 remain. Bridge portions 411, 412, and 413 are used to form the dielectric bridges for monolithic bridge capacitor 100.

Referring now to FIG. 5, a fifth process step in fabricating a monolithic bridge capacitor 100 in accordance with a preferred exemplary embodiment of the present invention is shown. In this step, a second metallization layer is formed over bridge portions 411, 412, and 413. In general, standard electrolytic plating may be used to form metal portions 511, 512, and 513. Metal portions 511, 512, and 513 are portions of the second capacitive plate for monolithic bridge capacitor 100 and, as shown in FIG. 5, are formed in at least two different layers of monolithic bridge capacitor 100. Specifically, a portion of metal portion 511 is formed in a second layer of monolithic bridge capacitor 100 and another portion of metal portion 511 is formed in a third layer of monolithic bridge capacitor 100. The layers shown in FIG. 5 have an orientation, which in this case is horizontal or substantially horizontal. While the various embodiments for the monolithic bridge capacitors are described or depicted herein as having horizontal or substantially horizontal layers, it should be noted that other orientations for the various layers are possible as well.

In FIG. 5, it should be noted that metal portions 512 and 513 are preferably orthogonal to metal portion 511. This relationship can be more clearly understood by referencing FIG. 7. Metal portion 540 provides an electrical connection for connecting the first capacitive plate to a larger integrated circuit. Additionally, metal portions 511, 512, and 513 of second capacitive plate pass over metal portions 111 and 112 of the first capacitive plate of monolithic bridge capacitor 100. Further detail about the formation of the structure of monolithic bridge capacitor 100 is presented below.

Referring now to FIG. 6, a sixth process step in fabricating a monolithic bridge capacitor 100 in accordance with a preferred exemplary embodiment of the present invention is shown. In this step, bridge portions 411, 412, and 413 are etched away. This is an optional step and bridge portions 411, 412, and 413 may be left in place, depending on the application. It might be desirable to leave bridge portions 411, 412, and 413 in place for structural stability or to change the capacitive coupling of the circuit. Obviously, if bridge portions 411, 412, and 413 are removed, the remaining structure resembles an "air bridge" and may be considered as such. Accordingly, in that configuration, the air provides the dielectric separation between the various portions of the first and second capacitive plates.

Referring now to FIG. 7, a schematic representation of a monolithic bridge capacitor 700 according to a preferred embodiment of the present invention is shown. Capacitor 700 is the completed structure formed by the steps of FIGS. 1–6. Section line 705 is the axis along which the sectional views shown in FIGS. 1–6 are taken. As shown in FIG. 7, monolithic bridge capacitor 700 has a first capacitive plate 710 and a second capacitive plate 720.

It should be noted that first capacitive plate 710 and second capacitive plate 720 are comprised of various smaller portions, similar to an interdigital capacitor and each of the smaller portions of each respective plate, taken together, form a single capacitive plate. At least a first portion of first capacitive plate 710 is formed in a first layer of monolithic bridge capacitor 700 and second capacitive plate 720 is formed in multiple layers of monolithic bridge capacitor 700. Capacitive plates 710 and 720 are not directly electrically connected but are capacitively coupled as they form the opposing capacitive plates of monolithic bridge capacitor 700.

Monolithic bridge capacitor 700 may be manufactured using any standard photolithography methods known by those skilled in the art. Typically, in the integrated circuit manufacturing process, various layers of metal and dielectric materials are deposited and then etched, thereby forming various circuit components. The capacitors of the present invention are well suited for these methods and do not require any non-standard process steps for manufacturing or integration/implementation with standard semiconductor device manufacturing as it is practiced in the art today.

As explained above, first capacitive plate 710 is typically formed by etching away at least a portion of a deposited first metallization layer in a monolithic integrated circuit. In the most preferred embodiments of the present invention, first capacitive plate 710 is completely formed in a first layer and is contained therein. Second capacitive plate 720 is formed in at least two different layers of monolithic capacitor 700 during a second metal deposition process. In the most preferred embodiments of the present invention, at least a first portion of second capacitive plate 720 is formed in a second layer of monolithic capacitor 700 when the second metallization layer is formed, but at least a second portion of second capacitive plate 720 is formed in a third layer of monolithic capacitor 700 when the second metallization layer is formed.

The first portion of capacitive plate 720, located in the second layer, and the second portion of capacitive plate 720, located in the third layer, are electrically connected by a metal connecting portion 715 that is typically formed as part of the second metallization layer. Depending on the exact configuration of capacitor 700, there may be multiple metal connectors 715, joining various portions of capacitive plate 720 to other portions of capacitive plate 720. Each metal connector 715 shown in FIG. 7 represents a change from a second layer to a third layer. For purposes of clarity in the drawing, not all metal connectors 715 are labeled in FIG. 7. Capacitive plates 710 and 720 will typically be connected to a larger integrated circuit by metal traces 730 and 740. In addition, in the most preferred embodiments of the present invention, various portions of second capacitive plate 720 will pass over various portions of first capacitive plate 710.

Figure 8:
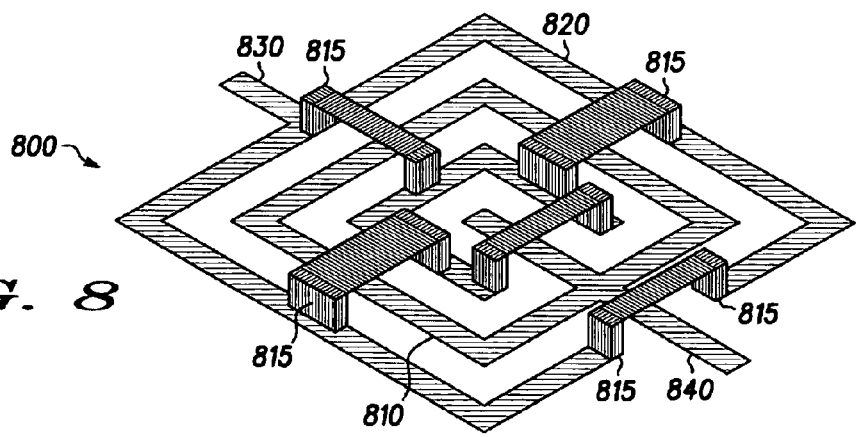
FIG. 8 is a schematic diagram of a monolithic bridge capacitor according to an alternative exemplary embodiment of the present invention.

Referring now to FIG. 8, a schematic view of a monolithic bridge capacitor 800 according to an alternative preferred embodiment of the present invention is shown. As shown in FIG. 8, monolithic bridge capacitor 800 has a first capacitive plate 810 and a second capacitive plate 820. The first portion of capacitive plate 820, located in the second layer, and the second portion of capacitive plate 820, located in the third layer, are electrically connected by a metal connecting portion 815 that is typically formed as part of the second metallization layer.

Depending on the exact configuration of capacitor 800, there may be multiple metal connectors 815, joining various portions of capacitive plate 820 to other portions of capacitive plate 820. Each metal connector 815 shown in FIG. 8 represents a change from a second layer to a third layer. Capacitive plates 810 and 820 will typically be connected to a larger integrated circuit by metal traces 830 and 840. In addition, in the most preferred embodiments of the present invention, various portions of second capacitive plate 820 will pass over various portions of first capacitive plate 810.

It should also be noted in FIG. 8 that the width of the traces for certain portions of second capacitive plate 820 are substantially wider than the traces that form first capacitive plate 810. This highlights another aspect of varying the capacitive coupling of monolithic bridge capacitor 800. By increasing the width of the traces that form second capacitive plate 820, the capacitive of monolithic bridge capacitor 800 is increased. Additionally, ohmic losses can be reduced.

Figure 9:
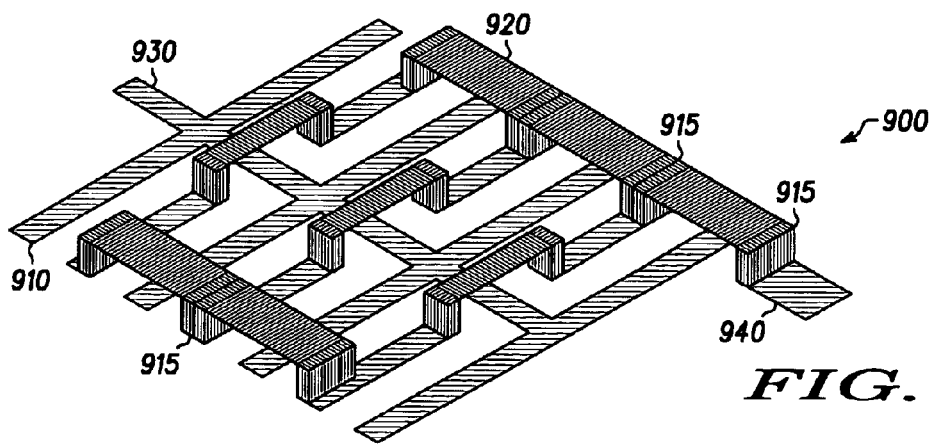
FIG. 9 is a schematic diagram of a monolithic bridge capacitor according to an alternative exemplary embodiment of the present invention.

Referring now to FIG. 9, a schematic view of a monolithic bridge capacitor 900 according to an alternative preferred embodiment of the present invention is shown. As shown in FIG. 9, monolithic bridge capacitor 900 has a first capacitive plate 910 and a second capacitive plate 920. The first portion of capacitive plate 920, located in the second layer, and the second portion of capacitive plate 920, located in the third layer, are electrically connected by a metal connecting portion 915 that is typically formed as part of the second metallization layer.

Figure 10:
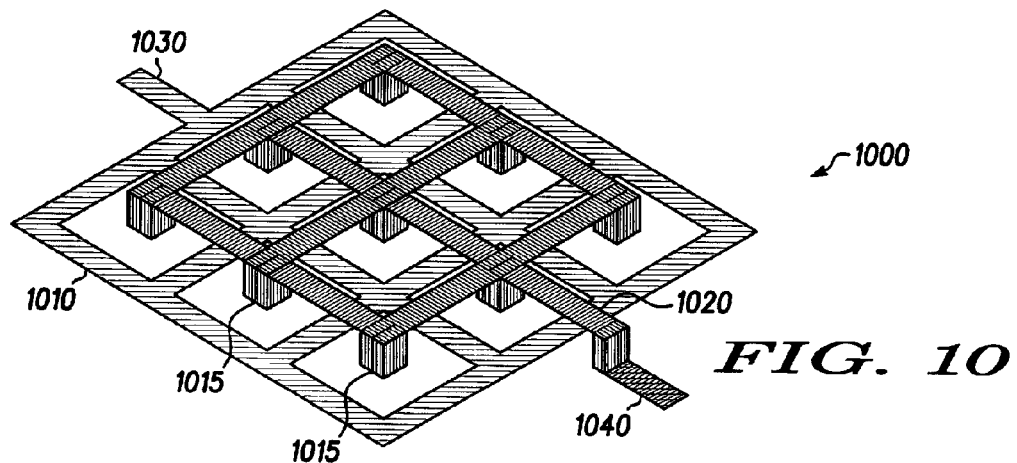
FIG. 10 is a schematic diagram of a monolithic bridge capacitor according to an alternative exemplary embodiment of the present invention.

Depending on the exact configuration of capacitor 900, there may be multiple metal connectors 915, joining various portions of capacitive plate 920 to other portions of capacitive plate 920. Each metal connector 915 shown in FIG. 9 represents a change from a second layer to a third layer. Capacitive plates 910 and 920 will typically be connected to a larger integrated circuit by metal traces 930 and 940. In addition, in the most preferred embodiments of the present invention, various portions of second capacitive plate 920 will pass over various portions of first capacitive plate 910. Monolithic bridge capacitor 900, as depicted in FIG. 9, is the most preferred embodiment of the present invention Referring now to FIG. 10, a schematic view of a monolithic bridge capacitor 1000 according to an alternative preferred embodiment of the present invention is shown. As shown in FIG. 10, monolithic bridge capacitor 1000 has a first capacitive plate 1010 and a second capacitive plate 1020. The first portion of capacitive plate 1020, located in the second layer, and the second portion of capacitive plate 1020, located in the third layer, are electrically connected by a metal connecting portion 1015 that is typically formed as part of the second metallization layer.

Depending on the exact configuration of capacitor 1000, there may be multiple metal connectors 1015, joining various portions of capacitive plate 1020 to other portions of capacitive plate 1020. Each metal connector 1015 shown in FIG. 10 represents a change from a second layer to a third layer. Capacitive plates 1010 and 1020 will typically be connected to a larger integrated circuit by metal traces 1030 and 1040. In addition, in the most preferred embodiments of the present invention, various portions of second capacitive plate 1020 will pass over various portions of first capacitive plate 1010.

Figure 11:
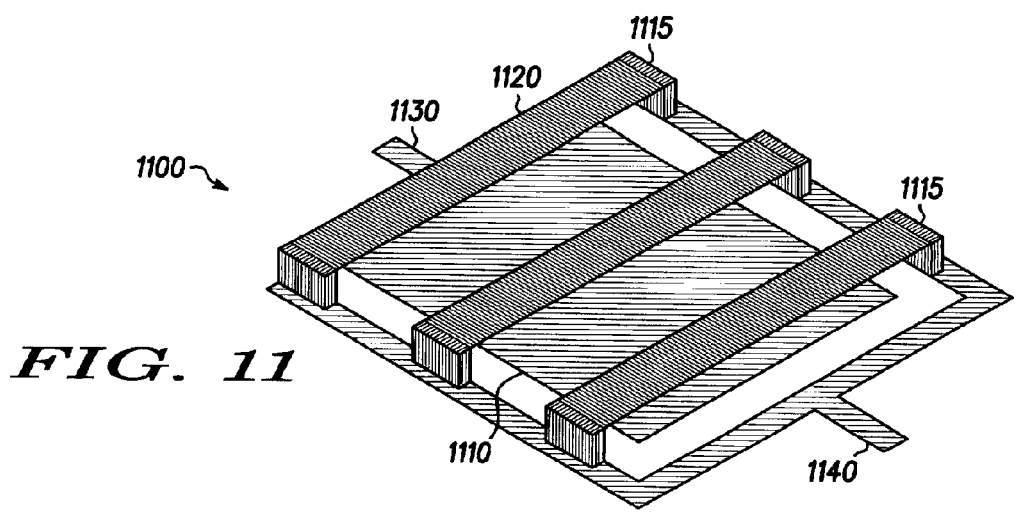
FIG. 11 is a schematic diagram of a monolithic bridge capacitor according to an alternative exemplary embodiment of the present invention.

Referring now to FIG. 11, a schematic view of a monolithic bridge capacitor 1100 according to an alternative preferred embodiment of the present invention is shown. As shown in FIG. 11, monolithic bridge capacitor 1100 has a first capacitive plate 1110 and a second capacitive plate 1120. The first portion of capacitive plate 1120, located in the second layer, and the second portion of capacitive plate 1120, located in the third layer, are electrically connected by a metal connecting portion 1115 that is typically formed as part of the second metallization layer.

Depending on the exact configuration of capacitor 1100, there may be multiple metal connectors 1115, joining various portions of capacitive plate 1120 to other portions of capacitive plate 1120. Each metal connector 1115 shown in FIG. 11 represents a change from a second layer to a third layer. Capacitive plates 1110 and 1120 will typically be connected to a larger integrated circuit by metal traces 1130 and 1140. In addition, in the most preferred embodiments of the present invention, various portions of second capacitive plate 1120 will pass over various portions of first capacitive plate 1110.

Figure 12:
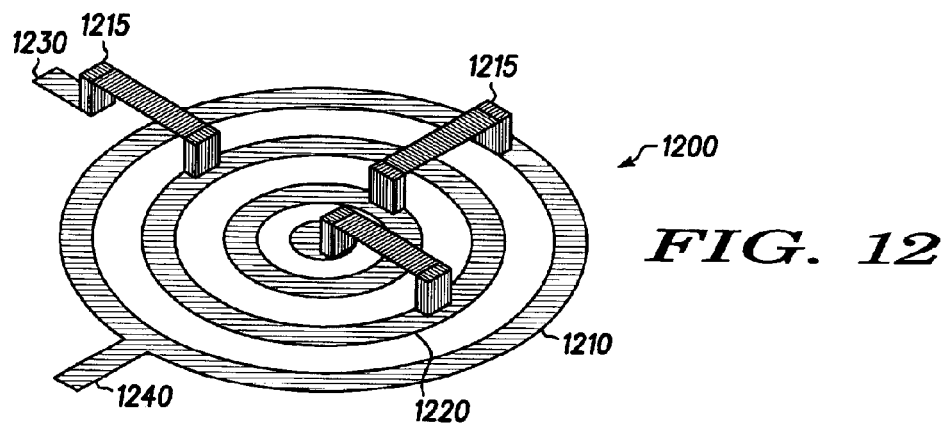
FIG. 12 is a schematic diagram of a monolithic bridge capacitor according to an alternative exemplary embodiment of the present invention.

Referring now to FIG. 12, a schematic view of a monolithic bridge capacitor 1200 according to an alternative preferred embodiment of the present invention is shown. In contrast with the previously depicted monolithic bridge capacitors of FIGS. 7–11, monolithic bridge capacitor 1200 is generally circular in shape. This embodiment is depicted to highlight that the capacitor structures of the present invention are not limited to traditional rectangular shapes but may be fabricated in various forms, according to the specific application. Additionally the overall structure of a monolithic bridge capacitor according to the preferred embodiments of the present invention may be triangular, in order to fit into a corner of an integrated circuit and so as to require less surface area on the integrated circuit. Finally, the corners of the rectangular structures may be mitered in accordance with industry standard practices.

As shown in FIG. 12, monolithic bridge capacitor 1200 has a first capacitive plate 1210 and a second capacitive plate 1220. The first portion of capacitive plate 1220, located in the second layer, and the second portion of capacitive plate 1220, located in the third layer, are electrically connected by a metal connecting portion 1215 that is typically formed as part of the second metallization layer.

Depending on the exact configuration of capacitor 1200, there may be multiple metal connectors 1215, joining various portions of capacitive plate 1220 to other portions of capacitive plate 1220. Each metal connector 1215 shown in FIG. 12 represents a change from a second layer to a third layer. Capacitive plates 1210 and 1220 will typically be connected to a larger integrated circuit by metal traces 1230 and 1240. In addition, in the most preferred embodiments of the present invention, various portions of second capacitive plate 1220 will pass over various portions of first capacitive plate 1210. Additionally, a via could be connected to one of capacitive plates 1210 or 1220 in order to form a shunt capacitor instead of the serial capacitors described in the previous FIGS.

Finally, while the present invention has been described with three layers and the first capacitive plate being formed in the first layer and the second capacitive plate being formed partially in the second and third layers, other configurations are possible. For example, using other fabrication processes, a first portion of the second capacitive plate could be formed in the same layer as the first capacitive plate and a second portion of the second capacitive plate could be formed in a second layer.

The monolithic bridge capacitors of the present invention are especially useful in microwave or millimeter wave circuit applications. This would include, but would not be limited to, low noise amplifiers, power amplifiers and mixers. Higher frequency design applications are most likely to benefit from employing the capacitors of the present invention, since they are more likely to require small capacitor values. Additionally, the compact nature and dense structure of the capacitors of the present invention provides an enhanced quality factor or "Q" for a given capacitor. Finally, the breakdown voltage for the capacitors of the present invention is significantly higher when compared to the breakdown voltage of a standard MIM capacitor. Where the breakdown voltage for a standard MIM capacitor may be in the range of 3V–25V, the capacitors of the present invention will have breakdown voltages in the range of 25V–200V.

The capacitors of the present invention can be implemented using any standard fabrication process for MMICs that incorporates the use of air-bridges. The methods of the present invention provide capacitors that have up to 30% or more capacitance than a standard interdigital capacitor in a similar area. At least a portion of the performance improvement comes from enhanced coupling capacitance due to the overlapping capacitive plates of the capacitor. However, the greatest increase in capacitance is realized from the geometric relationship between the different portions of the capacitive plates that are positioned next to one another. This design, made possible by the methods of the present invention, allows for higher yielding circuit designs at millimeter wave frequencies where small capacitor values are most often needed. The methods of the present invention as described herein allow for significant circuit size reduction compared to traditional interdigital capacitor designs. When coupled with the improved yields using the capacitors as described herein, the overall result is greater reliability in manufacturing yields at a lower production cost.

The methods of the present invention uses "air bridges" or some other dielectric medium to isolate certain portions of the two capacitive plates of a monolithic capacitor. By utilizing the methods of the present invention, certain geometries can be created that cannot be implemented using standard methodologies. The use of the air-bridge or other dielectric medium also contributes to an increased capacitance in a given area by positioning certain portions of the capacitive plates over certain portions of the opposing capacitive plates. The line widths, line separation, line geometry and number of levels used in the topology of the capacitor will determine the overall capacitance value of a given structure.

While various preferred exemplary embodiments have been presented in the foregoing detailed description, it should be appreciated that a vast number of variations exist. It should also be appreciated that the preferred embodiment presented herein are only examples and are not intended to limit the scope, applicability, or configuration of the invention in any way. Rather, the foregoing detailed description provides those skilled in the art with a convenient roadmap for implementing the preferred exemplary embodiment of the invention. It should be understood that various changes may be made in the function and arrangement of elements described in the exemplary preferred embodiment without departing from the spirit and scope of the invention as set forth in the appended claims.

What is claimed is:

1. A capacitor comprising:
   a plurality of layers in each of first, second and third spaced apart portions, said first portion positioned between said second and third portions;
   a first capacitive plate formed in said first portion of a first layer of said plurality of layers;
   a dielectric material;

first and second elements of a second capacitive plate formed in said second and third portions, respectively, or a second layer of said plurality of layers and separated by the dielectric material; and a third element of said second capacitive plate coupled between the first and second elements and formed in said first portion of a third layer of said plurality of layers;

wherein a dielectric separation between the first capacitive plate and the third element of the second capacitive plate comprises air, thereby defining at least one air bridge structure, and the first capacitive plate and the second capacitive plate are formed as a coupled transmission line structure that defines an interdigital capacitor which obtains its primary capacitance from the coupling of energy between a plurality of edges of the first capacitive plate and the first and second elements of the second capacitive plate.

2. The capacitor of claim 1 further comprising:

a first circuit connection, said first circuit connection electrically connecting said first capacitive plate to an integrated circuit; and a second circuit connection, said second circuit connection electrically connecting said second capacitive plate to said integrated circuit.

3. The capacitor of claim 2 wherein said second circuit connection is connected to a ground via.

4. The capacitor of claim 1 wherein said first orientation is a horizontal orientation.

5. A monolithic bridge capacitor comprising:

a plurality of layers in each of first, second and third spaced apart portions, said first portion positioned between said second and third portions;

a first capacitive plate formed in said first portion a first layer of said plurality of layers;

at least a first element of a second capacitive plate formed in said second portion of a second layer of said plurality of layers; and at least a second element of said second capacitive plate formed in said first portion of a third layer of said plurality of layers;

wherein a dielectric separation between the first capacitive plate and the second portion of the second capacitive plate comprise air, thereby defining at least one air bridge structure, and the first capacitive plate and the second capacitive plate are formed as a coupled transmission line structure that defines an interdigital capacitor which obtains its primary capacitance from the coupling of energy between a plurality of edges of the first and second capacitive plates.

6. The capacitor of claim 5 wherein said first orientation is a horizontal orientation.

7. A capacitor comprising:

a layered structure having first, second, and third spaced apart portions;

a first capacitive plate having first and second elements formed in said second and third portions of a first layer;

a dielectric material positioned between the first and second elements;

a second capacitive plate formed in said first portion of a second layer, positioned contiguous to the dielectric material and between the second and third elements, wherein a capacitance is primarily obtained between edges of the second capacitive plate and edges of the first and second elements; and an air bridge comprising a conductive material coupled between the first and second elements and partially positioned in said first portion of a third layer and separated from the second capacitive plate by air.

* * * * *